US008471531B2

(12) United States Patent
Roepke

(10) Patent No.: US 8,471,531 B2
(45) Date of Patent: Jun. 25, 2013

(54) ESTIMATED REMAINING LIFE OF A BATTERY INCLUDED IN AN UNINTERRUPTIBLE POWER SUPPLY

(75) Inventor: Jon Roepke, Hermosa Beach, CA (US)

(73) Assignee: Belkin International, Inc., Compton, CA (US)

( * ) Notice: Subject to any disclaimer, the term of this patent is extended or adjusted under 35 U.S.C. 154(b) by 618 days.

(21) Appl. No.: 12/395,508

(22) Filed: Feb. 27, 2009

(65) Prior Publication Data

US 2009/0189451 A1 Jul. 30, 2009

Related U.S. Application Data

(63) Continuation-in-part of application No. 11/688,788, filed on Mar. 20, 2007, now Pat. No. 7,518,265.

(51) Int. Cl.
*H02J 7/00* (2006.01)

(52) U.S. Cl.
USPC .............................................. 320/136; 30/132

(58) Field of Classification Search
None
See application file for complete search history.

(56) References Cited

U.S. PATENT DOCUMENTS

| 5,612,580 | A | 3/1997 | Janonis et al. |
| 5,995,400 | A | 11/1999 | Park et al. |
| 6,304,981 | B1 | 10/2001 | Spears et al. |
| 6,498,491 | B2 | 12/2002 | Plow et al. |
| 6,624,635 | B1 | 9/2003 | Lui |
| 6,784,641 | B2 * | 8/2004 | Sakai et al. ................... 320/132 |
| 7,218,078 | B2 * | 5/2007 | Gagnon et al. ................ 320/132 |
| 2002/0188878 | A1 | 12/2002 | Lee |
| 2005/0162019 | A1 * | 7/2005 | Masciarelli et al. ............ 307/66 |
| 2006/0274764 | A1 | 12/2006 | Mah et al. |
| 2007/0164707 | A1 * | 7/2007 | Suzuki et al. ................. 320/132 |
| 2007/0188144 | A1 * | 8/2007 | Hara et al. .................... 320/132 |

OTHER PUBLICATIONS

"Local Versus Network Power for Cable Telephony", White Paper #80; 2006; American Power Conversion; 12 Pgs.
"Understanding Power Factor, Crest Factor, and Surge Factor", White Paper #17; 2006; American Power Conversion; 6 Pgs.
"Uninterruptible Power Source", User's Guide; Revised Jul. 1997; American Power Conversion; 19 Pgs.

* cited by examiner

*Primary Examiner* — Drew A Dunn
*Assistant Examiner* — Robert Grant
(74) *Attorney, Agent, or Firm* — O'Melveny & Myers LLP

(57) ABSTRACT

An uninterruptible power supply ("UPS") is provided with a backup power supply that has an adjustable reserve power level that is based on a user's input and/or is configured to notify a user if a battery included in the UPS needs to be replaced. In one embodiment of the present invention, the UPS (or a circuit included therein) estimates a remaining life (ERL) of the battery by considering various battery conditions, including, but not limited to, a predetermined battery life expectancy, whether the battery is being used to power a load, and battery temperature. If it is estimated that the ERL is low, or below a predetermined threshold, then the UPS (or a circuit included therein) is configured to notify a user that the battery needs to be replaced.

20 Claims, 5 Drawing Sheets

ESTIMATED REMAINING LIFE OF A BATTERY INCLUDED IN AN UNINTERRUPTIBLE POWER SUPPLY

RELATED APPLICATION

This application is a continuation-in-part of application Ser. No. 11/688,788, filed Mar. 20, 2007 now U.S. Pat. No. 7,518,265, which application is incorporated herein, in its entirety, by reference.

BACKGROUND OF THE INVENTION

1. Field of the Invention

The present invention relates generally to an uninterruptible power supply ("UPS") and more particularly to a UPS that has an adjustable reserve power level that can provide power to attached load devices when the input power source drops below a user selected threshold voltage level for more than a minimum time interval and/or circuitry for estimating a remaining life of at least one battery included therein.

2. Description of Related Art

A large number of electronic devices require continuous power for proper operation. For example, computers must receive continuous power in order to avoid costly down time, and more importantly, prevent the loss of data. In an Internet-based telephone system, such as Voice over Internet Protocol ("VoIP"), power is usually furnished to the telephone system through an AC power line or AC mains. However, during power outages, it can become critical that the telephone system operate reliably using an auxiliary power source such as a UPS in case of emergencies. It is desirable to eliminate unforeseeable power line disturbances ranging from deviations from the specified line voltage known as "Brown-outs" or "Brown-power" to complete power loss to provide continuous power to electronic devices and/or computers.

Moreover, since AC power line failures occur rather infrequently, a user often is unaware of the current state and reserve power capacity of the internal battery of the UPS. Thus, it is important that the current reserve capacity of the UPS be known in advance of the UPS switching over to this backup power source during a time of power outage, so she can plan accordingly regarding use of devices (e.g., the VoIP telephone system) connected to the UPS. It is also important to advise the user how much reserve time capacity remains while the VoIP system is operating on reserve battery power from an auxiliary power source such as a UPS. Further, it is desirable to provide the user with accurate estimates of remaining time while connected devices to the UPS are running on auxiliary power. Further still, it is important to advise the user when to replace the battery due to insufficient reserve capacity, rather than make this determination when there is no alternative power source available.

A common type of UPS utilizes an array of on-board storage devices or batteries to supply reserve power when there is a line disturbance or power shortage on the power source line. These are commonly known as a "standby UPS" or offline UPS design. These storage devices only provide adequate power for a single short period of time before the internal battery needs to be recharged. Therefore, an immediate switch from AC main power to reserve power from the internal battery when the AC main power line voltage sags below a threshold value may result in premature depletion of available battery power.

Another common type of UPS is designed so that an AC to DC inverter is always connected to the output line of the UPS. This design is known as a "line-interactive UPS." When the AC input power is present, the inverter operates in reverse to charge the internal batteries. When AC input power fails, the UPS reverses the power flow from the inverter and provides power to the load. This design provides better filtering than a standby UPS, because the inverter is always connected to the load. But, the line-interactive UPS still suffers from the drawback of the storage devices only providing adequate power for a single short period of time before the internal battery needs to be recharged.

There are situations in which it would be useful for a UPS to either have two or more separate reserve power supply sources or the ability to reserve or hold back a portion of the battery reserve power from one or more reserve power supply sources. This way, after the initial battery reserve power is exhausted, the user can again activate the UPS to supply an additional second period of reserve power to the attached devices. For example, the user may need to send or check her email on her computer and just needs to power up or activate her computer for a short time or she needs the ability to access the Internet on her computer to accomplish a task before the AC power source is restored. One area of growing importance is with respect to VoIP systems as mentioned above, wherein the user wants to be able to make telephone calls over the system when the AC power source has failed. The VoIP utilizes the user's Internet hub, router, cable modem, and/or ADSL modem, which are often powered by the AC mains. This can be critical in the case of an emergency where the user urgently needs to call the fire, police department, ambulance or 911 service and the like.

Accordingly, there is a need for a UPS design that gives the user the ability to adjust the reserve power level of the battery or on-board storage device so that she can later reactivate the UPS and use an attached electronic device after the initial reserve power supplied has been exhausted. Additionally, the ability of the UPS to provide the user with an accurate estimate of the backup power available from the internal battery, taking into account the attached device load, would allow the user to properly adjust the reserve power level to provide adequate power to reactivate the UPS when a user demand for backup power is received. There is also a need for a UPS design that estimates a remaining life of a battery included in the UPS and notifies a user when the battery needs to be replaced (e.g., when the battery no longer holds a charge, etc.).

SUMMARY OF THE INVENTION

The present invention in an embodiment provides a UPS with an adjustable reserve backup power supply, wherein the reserve level is based on an input from the user. The UPS can later be reactivated from a shutdown state "on demand" when a user demand for the backup power is received. The UPS supplies stored AC power so that when the AC power line input voltage level falls below a threshold voltage level for more than a minimum time interval and the UPS effects a shutdown, the user can reactivate the UPS to supply stored AC power to the connected devices. The available reserve power level can be based on a plurality of predefined values or settings stored in a table or can be proportional to a user input. The user can adjust or select the reserve power level setting from a panel on the UPS or via software executing on her computer that communicates with the UPS. The UPS can ration the amount of reserve power from one or more reserve power sources.

In one embodiment, the invention can utilize a modified standby UPS design, while in another embodiment the invention can utilize a modified line-interactive UPS design. The invention can also be adapted to work with other UPS designs.

In another embodiment, the user can remotely adjust the reserve power levels based on an estimate of the remaining time that the reserve backup supply could adequately power the devices currently connected to the output terminals of the UPS. The user may remotely reactivate the UPS by use of a signal command. In yet another embodiment, the user can adjust the reserve power level to a percentage of available battery power.

In another embodiment, the UPS notifies a user if the remaining life of a battery included in the UPS is low, indicating that the battery needs to be replaced. In accordance with this embodiment, the UPS (or a circuit therein) estimates a remaining life of the battery by considering various battery conditions, including, but not limited to, battery life expectancy, whether the battery is being used to power a load, and battery temperature.

In accordance with one aspect of the embodiments described herein, a method is provided for controlling the utilization of backup power, wherein a user input is received regarding how much power to reserve. A reserve level is then set based on the user input. The level of the backup power available is measured and the system determines whether the measured level meets the set reserve level and whether there is a power outage. During the power outage, the system causes a shutdown of the devices connected to the system when the measured level fails to meet the set reserve level. The backup power can later be utilized when a user demand for the backup power is received by the system.

In accordance with another aspect of the embodiments described herein, a system is provided for controlling the utilization of backup power. The system comprises an input device for receiving a user input, a processor module connected to the user input device, and a memory module connected to the processor module. The memory module stores executable code that the processor module can execute or run to set a reserve level based on the received user input. The level of the backup power available is then measured and the processor determines whether the measured level meets the set reserve level. The processor then determines whether there is a power outage. During the power outage, if the processor determines that the measured level fails to meet the set reserve level, the processor then causes a shutdown of the devices connected to the system. When the processor later determines that a user demand to utilize the backup power has been received, the system then utilizes the backup power.

In accordance with yet another aspect of the embodiments described herein, a system is provided for controlling the utilization of backup power in a computer network. The system comprises a server connected to the computer network and an application executing in association with the server. Together, the system can receive a user input regarding how much power to reserve, set a reserve level based on the user input, and measure the level of the backup power available. The system then determines whether the measured level meets the set reserve level, and determining whether there is a power outage. During the power outage, when the measured level fails to meet the set reserve level, the system causes shutdown of the devices connected to the system. When the system later determines that a user demand to utilize the backup power has been received, the system then utilizes the backup power.

A more complete understanding of the UPS that can be reactivated on-demand and/or can estimate a remaining life of a battery included in the UPS will be afforded to those skilled in the art, as well as a realization of additional advantages and objects thereof, by consideration of the following detailed description of embodiments of the invention. Reference will be made to the appended sheets of drawings, which are described below.

DETAILED DESCRIPTION OF EMBODIMENTS

The present invention in an embodiment provides a UPS with an adjustable reserve power supply that can provide reserve power that can later be activated "on demand" by the user to drive an attached electrical load. The UPS utilizes at least one rechargeable battery that can supply stored AC power for an adjustable time interval when the AC power line input voltage level falls below a threshold level and a shutdown has occurred. The user can adjust the reserve power level from a panel on the UPS or via software, executing on her computer and that communicates with the UPS. The user can make a demand on the UPS from a panel on the UPS or via a computer command sent by her computer to reactivate the UPS and supply stored AC power to connected devices. The invention can be utilized with a modified standby UPS design as well as a modified line-interactive UPS design. In the detailed description that follows, like element numerals are used to indicate like elements appearing in one or more of the figures.

Figure 1:
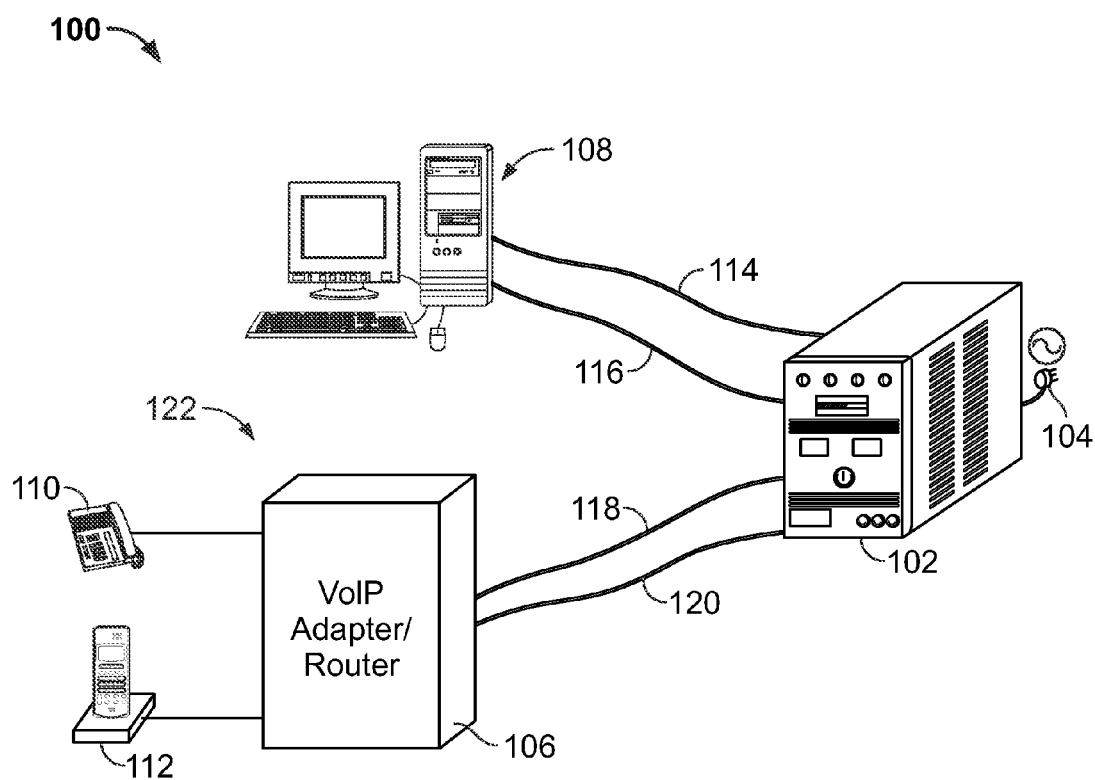
FIG. 1 is a diagram illustrating one embodiment of a UPS with on-demand reserve power interconnected to a computer and a VoIP system.

FIG. 1 is a diagram illustrating one embodiment of a UPS 102 with on-demand reserve power interconnected to a computer system or PC or workstation 108 and a VoIP system 106. The UPS 102 connects to an AC power source via an AC power plug 104 and comprises an internal rechargeable battery or set of batteries. In FIG. 1, the UPS 102 is connected to the computer system 108 by an AC power cable 114 and data communications cables 116. Cables 116 and 120 comprise an Ethernet network cable and a USB cable. The UPS 102 is also connected to an Internet Telephone or VoIP system 122 by an AC power cable 118 and data communications cables 120. The VoIP system 122 comprises a corded type IP telephone 110 and a cordless IP telephone 112.

The UPS 102 conditions and filters the AC power supplied to the AC power cables 114 and 118, as well as supplying reserve power from an internal battery (not shown) when the AC main power source connected to AC power plug 104 falls below a minimum preset threshold voltage level or is interrupted for beyond a minimum preset time interval. The UPS 102 also filters voltage spikes and line noise that can occur on the communications cables 116 and 120. AC power cables from additional types of devices such as home theater equipment, home stereos and the like can be connected to the UPS 102 for power line protection and filtering by connecting similar AC power cables (not shown) to the available AC power outlets 308b of the UPS 102 (see FIG. 3). As will be discussed further below with respect to FIGS. 2 and 3, other types of communications cables can be connected to the UPS 102, such as telephone lines (for fax machines, modem and telephones) and coaxial cables (for cable modems).

Returning now to FIG. 1, the computer system 108 can control the configuration and settings of the UPS 102 by executing computer code or running software or a computer program (not shown) that is stored on a computer readable medium (such as a hard disc drive) that can be internal or external to the PC 108. In order to do so, the computer system 108 communicates with the UPS 102 via the cables 116. Similarly, the UPS 102 comprises a memory module (not shown) and a processor module (not shown) that interface with the PC 108 via the cables 116. The UPS 102 utilizes a computer program or software or executable code (not shown) stored on an internal non-volatile memory unit such as a flash memory device that allows the UPS 102 to control the utilization of backup power.

The software on the PC 108 can be loaded into memory and the program executed or run. The program allows the PC 108 to accept user input from a human machine interface ("HMI") device (such as a mouse or keyboard) to set the reserve power level desired by the user. The PC 108 can communicate with a processor module or controller (not shown) within the UPS 102 to obtain a measurement of the backup power available. More specifically, the available reserve power quantity or level can be divided or split into two reserve power quantities and be supplied from one or more batteries. This allows the UPS 102 to supply the reserve power to the PC 108 and the VoIP adapter 106 connected to the AC power cables 114 and 118 (as well as any other similar device connected to the UPS 102), respectfully, from just after the AC power source fails until the first reserve power quantity is exhausted. Before the first reserve power quantity is completely exhausted, the UPS 102 can transmit a shutdown signal to the PC 108 via the cables 116, instructing the PC 108 to exit all running programs and the operating system for a so-called "graceful exit." The UPS 102 can also transmit a sleep mode or standby mode signal to the PC 108, thereby instructing the PC 108 to exit all running programs and enter the power saving sleep mode.

In another embodiment, the PC 108 determines whether the measured level of backup power communicated to the PC 108 via the cables 116 from the UPS 102, meets the reserve level selected by the user. As long as the user selects a reserve power level of less than 100 percent of the available backup power, the UPS 102 can automatically begin supplying reserve power from the backup power supply if there is even a momentary power failure. The PC 108 uses the monitoring data from the UPS 102 to determine when there is an ongoing power outage and during the power outage, affects a shutdown when the measured power level fails to meet the reserve power level set by the user.

Returning now to the embodiment shown in FIG. 1, the UPS 102 reserves a portion of the first reserve power quantity to supply sufficient power to the PC 108 for a predefined time interval. As the predefined time interval comes close to completion, the UPS 102 can flash indicator lights and/or produce a loud sound to warn the user that the PC 108 will be sent a shutdown signal shortly unless the AC power source connected to connector 104 is quickly restored or the second reserve power quantity is activated by the user. While the PC 108 is in sleep mode, the user can wake the PC 108 or reactive normal operation mode for a short time interval and input a command from the HMI device, thereby instructing or demanding the UPS 102 to reactivate itself from the second reserve power quantity. The user can also activate the second reserve power quantity from controls mounted on the exterior case of the UPS 102 or in other embodiments, from a remote signal sent over a wired or wireless Local Area Network. The software running on the PC 108 can also be used to set and adjust the configuration settings of the UPS 102 that correspond with the settings made through the front panel of the UPS 102, as discussed with respect to FIG. 2 below.

Once the second reserve power quantity is activated, the user can operate her VoIP telephone router system 122 to make or receive urgent or emergency telephone calls or she can return her PC 108 to normal operation mode and send or receive email messages. Operation of the PC 108 and/or the VoIP system 122 can continue until the second reserve power level is exhausted (at which time the PC 108 can again be sent a shutdown instruction by the UPS 108) or the AC power source connected to connector 104 is restored.

In another embodiment, the user can reserve a predetermined reserve power quantity from the available reserve power of the UPS 102. The user can choose whether to reserve this power quantity or not via the available controls on the exterior of the UPS 102 (see FIG. 2 and description below) or via the software running on her PC 108. In yet another embodiment, a single predetermined quantity of reserve power is provided, wherein the user cannot change or disable the use of the single predetermined quantity of reserve power from the UPS 102.

Figure 2:
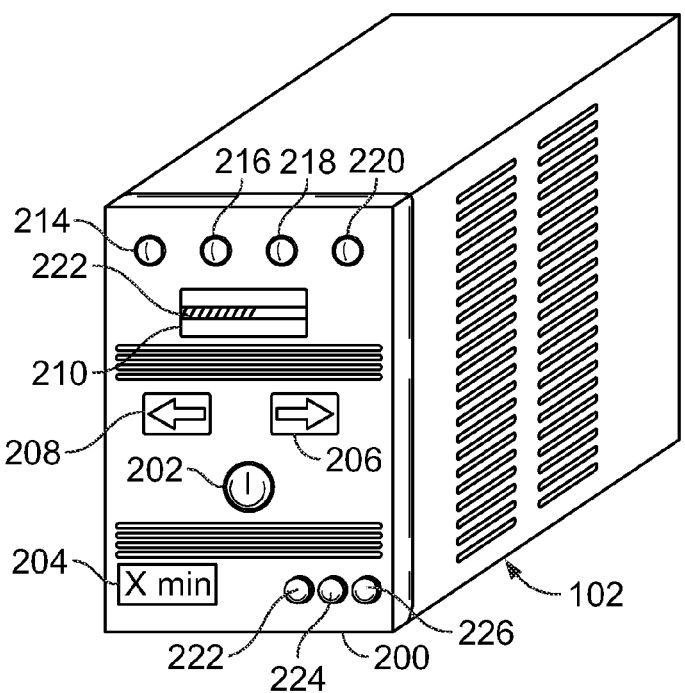
FIGS. 2 and 3 are perspective views of the outer appearance of one embodiment of the UPS that incorporates the current invention.
Figure 3:
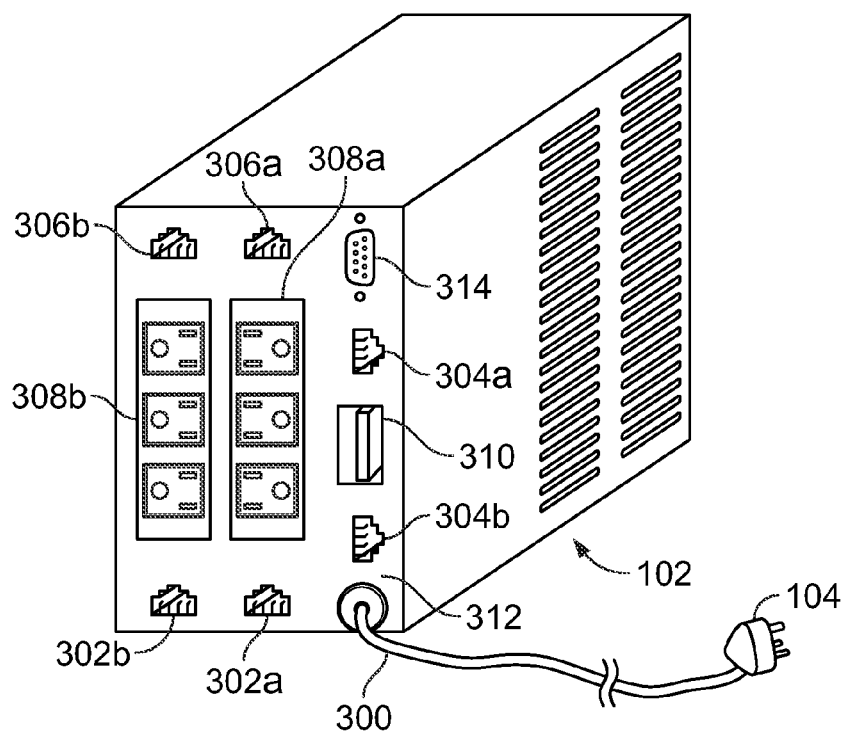

FIGS. 2 and 3 are perspective views of the outer appearance of one embodiment of the UPS 102 that incorporates the current invention. FIG. 2 illustrates the controls and displays on the front panel 200 of the UPS 102, while FIG. 3 illustrates various connectors mounted on the rear panel 312 of the UPS 102. In FIG. 2, the front panel 200 comprises indicators 214-220, graphic display unit 210, text display unit 204, power button 202, and control buttons or switches 206-208, and 222-226. Indicators 214-220 can indicate various messages to the user by illuminating in different colors regarding the status and operation of the UPS 102. For example, indicator 214 can indicate that the UPS 102 is operating on AC power. Indicator 216 can indicate that the UPS 102 is operating on the first reserve power quantity and indicator 218 can indicate that the UPS 102 is operating on the second reserve power quantity. Indicator 220 can indicate that the internal rechargeable battery is not properly holding a charge and needs to be replaced soon. One of skill in the art will recognize that indicators 214-220 can indicate other messages to the user as well, such as power overload (i.e., the devices connected to the UPS 102 exceed the reserve power output capacity of the UPS 102) or that the AC power voltage level is low or sagging (e.g., a brown-out).

In FIG. 2, graphic display unit 210 comprises a bar graph display 222 that can display the percentage of available reserve power remaining for the first and/or second reserve power levels or quantities. The bar graph display 210 can be toggled between the first and second reserve power quantities by pushing control button 222. In other embodiments, the graphic display 222 can indicate other information to the user such as estimated time in minutes remaining for the first and/or second reserve power quantity to supply battery power to the PC 108, the VoIP system 222 (see FIG. 1), or other devices connected to the AC output connectors 308b (see FIG. 3). The time estimates are based on internal calculations by the UPS 102 that include the estimated power consumed by the devices connected to 308b (i.e., the power load). One of skill in the art will recognize that display unit 210 can comprise other types of display units, such as analog meters or gauges, within the spirit and scope of the invention.

The power button 202 can serve multiple functions. For example, pushing and releasing the button 202 quickly toggles the UPS 102 between a power on and a power off state, while pushing and holding the power button 202 in a depressed mode for a predetermined time will cause the UPS 102 to run self-diagnostic tests.

The text display unit 204 can display various text character messages such as a digital representation of the estimated minutes of reserve power remaining for the first and second reserve power quantities or the available reserve level percentages that can be set by the user for the first and second power quantities. The user can provide a digital input to the UPS by digitally setting the desired reserve power levels and/or various configuration settings with the control buttons 222-224 or as mentioned above with respect to FIG. 1, the user can set the configuration settings remotely with the software running on her PC 108. In other embodiments, the control buttons 222-226 can instead comprise rotating knobs. The user can then set the reserve power level by providing an analog input to the UPS by rotating the control buttons 222-226 and can view the desired settings on the graphical display unit 210.

Returning to the embodiment of illustrated in FIG. 2, the control buttons 206 and 208 can also be used to adjust the percentage split of the reserve power quantity between the first reserve power quantity and the second reserve power quantity. As illustrated, control buttons 206 and 208 are "arrow shaped" to indicate to the user their function, but other button shapes such as simple round buttons are within the spirit and scope of the invention. The adjustment can be in a plurality of predefined steps such as in 2 minute or 5 percentage increments that are defined in a corresponding table of predefined values (e.g., a lookup table). In other embodiments, the steps can be selected from a continuous range of available settings by holding down the buttons until the desired minutes or percentage is displayed in the display unit 204. The control buttons 222-224 can be used to configure the UPS 102 to transmit a shutdown or a sleep mode signal to the PC 108 when the AC power connected to power connector 104 (see FIGS. 1 and 3) drops below a minimum preset threshold voltage level for more than a minimum interruption interval. On such an occurrence, the UPS 102 switches to battery supplied reserve power.

In FIG. 3, the rear panel 312 comprises telephone, fax or modem connectors 304a and 304b, data port connectors 302a, 302b, 306a, and 306b, AC power outlets 308b, USB port connector 310, RS232 port connector 314, AC power cord 300, and AC power plug 104. The power plug 104 is attached to the power cable 300 and supplies AC power to the UPS 102 from the AC main line in the user's home or place of business. The power source as illustrated is at 120VAC; however, the invention can be easily adapted to operate on 220VAC as well. AC power for PC 108 and VoIP system 122 can be supplied by connecting AC power cables 114 and 118 to AC power outlets 308b. Other compatible devices such as home theater systems can similarly be protected by the UPS 102 by connecting their AC power cables (not shown) to the available power outlets 308b. The total power draw of all the devices connected to the UPS 102 must not exceed the particular volt-ampere rating of the UPS 102 or there will be insufficient battery supplied reserve power to operate the connected devices for more than a few minutes at best (i.e., an overload condition will result). Additionally, one of the indicators 214-220 will be triggered to inform the user of an overload condition. In other embodiments, an audible alarm can also be triggered to catch the attention of the user who may not have visual access to the front panel 200.

The USB port connector 310 or the RS232 port connector 314 can be used to communicate between the UPS 102 and the PC 108, while the UPS 102 can communicate with the VoIP system 122 via one of the data port connectors 302a, 302b, 306a or 306b. In particular, the cable 116 can be connected to the USB port connectors 310 or the RS232 port connector 314 and the cable 120 can be connected to one of the data port connectors 302a, 302b, 306a or 306b. Shutdown and sleep mode signals can be transmitted to the PC 108 and the VoIP system 122 via these same port connectors and cables. Further, as discussed above with respect to FIG. 1, software running on the PC 108 can control and configure the UPS 102 remotely by way of the USB port connector 310 or the RS232 port connector 314. In another embodiment (not shown), the UPS 102 can be connected to a computer network such as a wired or wireless Local Area Network (LAN) using an industry standard protocol such as the 802.11x series. The UPS 102 can communicate with the PC 108 and/or the VoIP system 122 via a remote signal over the LAN connection instead of utilizing the USB port connector 310 or the RS232 port connector 314 to communicate with the PC 108.

Modem connectors 304a and 304b comprise industry standard RJ-11 connectors and data port connectors 302a, 302b, 306a, and 306b comprise industry standard RJ-45 connectors. One of skill in the art will recognize that connectors 302a, 302b, 306a, and 306b can comprise other types of data port connectors (such as BNC connectors) within the spirit and scope of the invention. Similarly, connectors 304a and 304b can comprise other types of connectors, such as RJ-14 connectors that support two line telephones. These six connectors comprise three pairs of connectors, wherein one connector from each pair is an input side connector and the other three are output side connectors that attach to the communication cables 116 and 120. The UPS 102 suppresses undesired voltage spikes and filters out electronic noise present from the incoming set of connectors that comprise connectors 302a-308b and the resulting clean signal lines connect to the output side of connectors 302a-308b.

Figure 4:
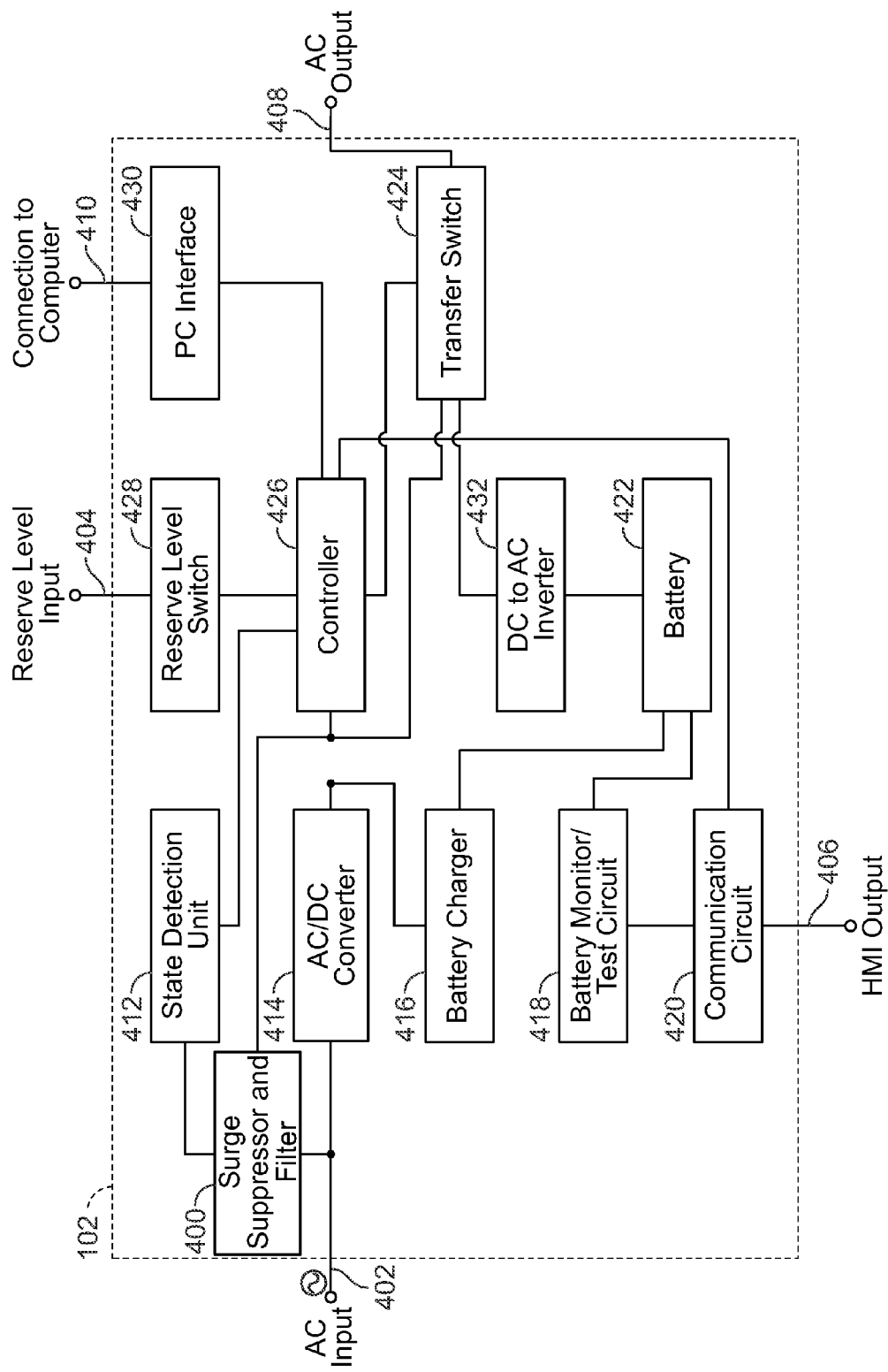
FIG. 4 is a functional block diagram of one embodiment of the UPS with on-demand reserve power, based on a standby UPS design.

FIG. 4 is a functional block diagram of one embodiment of the UPS 102 with on-demand reserve power, based on a standby UPS design. The external connections to the UPS 102 comprise an AC input connection or input 402, a reserve level input 404, a computer connection 410, an HMI output 406, and an AC output connection or output 408. AC input 402 connects to an available AC main line electrical outlet that is at 120VAC; however, the invention can be adapted to use other voltage levels such as 220VAC. AC input 402 can connect to AC power cord 300 and AC power plug 104 (see FIG. 3). AC output 408 can connect to at least one set of AC power outlet connectors such as AC power outlet 308b (see FIG. 3) that provides noise filtered and voltage spike suppressed AC power that can be supplied by battery backup power from a battery or set of batteries 422. Reserve level input connection 404 is an input device that allows the user to adjust or balance the available reserve battery quantity between a first reserve power quantity and a second reserve power quantity, as discussed above with respect to FIGS. 2 and 3. Reserve level input connection 404 can be connected to control buttons 206-208 and 222-226 (see FIG. 2) or a remote switch (not shown) to adjust the reserve power quantity. The reserve level input 404 can be continuously variable or can comprise preset values stored in a table in non-volatile memory.

Computer connection 410 is optional and allows the user to control and adjust settings of the UPS 102 remotely by use of her PC 108 (see FIG. 1) by use of the USB port connector 310 or the RS232 port connector 314 (see FIG. 3) and the communication cable 116 (see FIG. 1). HMI output 406 is optional and can provide visual and/or audible information and feedback to the user to assist her in setting the reserve power quantity and to inform her of changes to the operating state of the UPS 102. For example, the HMI output 406 can be connected to indicators 214-220, graphic display unit 210, and/or the textual display unit 204 (see FIG. 2). These indicators can inform the unit of conditions such as when the UPS 102 is operating on battery power, the current amount of remaining reserve power, or that the internal battery backup is not properly holding a charge and needs to be replaced. Similarly, audible alarms can be utilized to indicate such changing operating conditions of the UPS 102 (e.g., warbling or chirping sounds to catch the attention of a user who is not necessarily visually monitoring the UPS front panel indicators). The HMI output 406 can also be interconnected with the optional computer connection 410 to provide notifications to the user through her PC 108 (e.g., pop-up messages or audible warnings).

The internal components illustrated in FIG. 4 comprise a surge suppressor and filter 400, a state detection unit 412, an AC/DC converter 414, a battery charger 416, a battery monitor/test circuit 418, a communications circuit 420, a reserve level switch 428, a controller 426, a DC to AC inverter, the battery 422, a PC interface 430, and a transfer switch 424. These components form a standby UPS with additional elements and features. The standby UPS is commonly used with PCs. In the modified standby UPS block diagram illustrated in FIG. 4, the transfer switch 424 selects the filtered AC input exiting from the surge suppressor and filter 400 as the primary power source, and switches to the DC to AC inverter 432 supplied by the battery 422, should the primary power source supplied by the AC input 402 fail. This occurs when the voltage level of the AC mains falls below a preset voltage level or is interrupted for more than a preset time interval. The transfer switch 424 then switches the load over to the battery 422 and inverter 432 output backup power sources. The inverter 432 converts the DC battery voltage output to 120VAC and only operates when the power fails, hence the name "Standby."

The controller 426 is the electronic brain of the UPS 102 and can comprise a processor module, a microprocessor, a central processing unit ("CPU") or more commonly, a microcontroller unit ("MCU") with an internal memory unit such as a non-volatile memory module (e.g., a ROM, or flash memory device). The controller 426 receives and transmits data from the surge suppressor and filter 400, the state detection unit 412, the reserve level switch 428, the PC interface 430, the transfer switch 424, and the communications circuit 420. The controller can make decisions based on the executable code programmed at the time of manufacture and stored in internal memory that can be updated or modified via the PC interface 430 that interconnects to the PC 108 by the computer connection 410. The controller 426 logically decides such things as when to switch over the AC output connection 408 to the first and/or second reserve power quantities and when to issue a shutdown or sleep mode command to the PC 108 or VoIP system 122, as discussed with respect to FIG. 1 above. The state detection unit 412 monitors the AC line condition of the AC input 402 from the surge suppressor and filter 400 and detects an interruption in the AC main power source that is connected to the AC input 402. The state detection unit 412 reports monitoring data to the controller 426, so that the controller 426 can determine when a power outage occurs. This data can be communicated to the user via the communication circuit 420 and the HMI output 406. The reserve level switch 428 receives the related reserve level data input data from the reserve level input connection 404 and in conjunction with the controller 426, causes the transfer switch 424 to switch power sources from the AC main line to reserve power supplied via the battery 422 and the DC to AC inverter 432. This "switch over" occurs at the appropriate time and duration to correspond to the desired first reserve power quantity and second reserve power quantity selected by the user.

The battery 422 is connected to the battery charger 416, unless the AC main power source connected to the AC input 402 fails. The battery charger 416 functions in conjunction with the AC/DC converter 414 to prevent overcharge of the battery 422. The DC output level or charge state of the battery is monitored or measured periodically by the battery monitor/test circuit 418 and the results can be reported to the user via the communications circuit 420 and to the controller 426. The controller 426 uses this measurement information to predict the level of backup power available as well as how long the first and second reserve power quantities can operate the devices currently attached to the AC power outlets 308*b* (i.e., the attached electrical load). Variations of the organization and interconnections of the elements of the UPS 102 that provide an adjustable reserve backup power supply are within the spirit and scope of the invention.

In one embodiment of the present invention, the battery monitor/test circuit 418 uses at least one algorithm and values representing various battery conditions to estimate a remaining life (ERL) of the battery 422. For example, the ERL can be calculated using a predetermined life-expectancy value of the battery, a battery temperature value, and a value that indicates whether the battery is being used to power a load (not shown). By way of example only, a battery may have a predetermined life-expectancy of three years, or 262,800 Counts if the battery's remaining life is estimated every six minutes. If we assume that the battery's life is extended by 20% if the battery is not connected to the load, and it is reduced by 40% for every 5° Celsius that the battery's temperate is above 25° Celsius, then the ERL of the battery can be calculated using the following algorithm:

$$ERL = Count - (Kstatus)(Ktemp),$$

wherein Kstatus is calculated every hour and represents whether the battery is being used to power the load (e.g., Kstatus=10 if the battery is being used to power the load and Kstatus=8 if the battery is not being used to power the load) and Ktemp is calculated every hour and represents the battery's temperature (e.g., Ktemp=1.0 if the battery's temperature is 25° C., Ktemp=1.4 if the battery's temperature is 30° C., etc.). Once the ERL reaches zero, the battery monitor/test circuit 418 (e.g., via the communication circuit 420, the HMI output 406 and/or the indicators 222-226) notifies a user that the battery should be replaced. In alternate embodiments of the present invention, the battery monitor/test circuit 418 is further (or alternatively) adapted to notify the user if the ERL is at 80% and/or 90% of the life expectancy of the battery.

It should be appreciated that the present invention is not limited to the foregoing algorithm, and that various modifications and/or derivations thereof are within the spirit and scope of the present invention. Thus, for example, an algorithm that includes additional or fewer variables is within the spirit and scope of the present invention.

Figure 5:
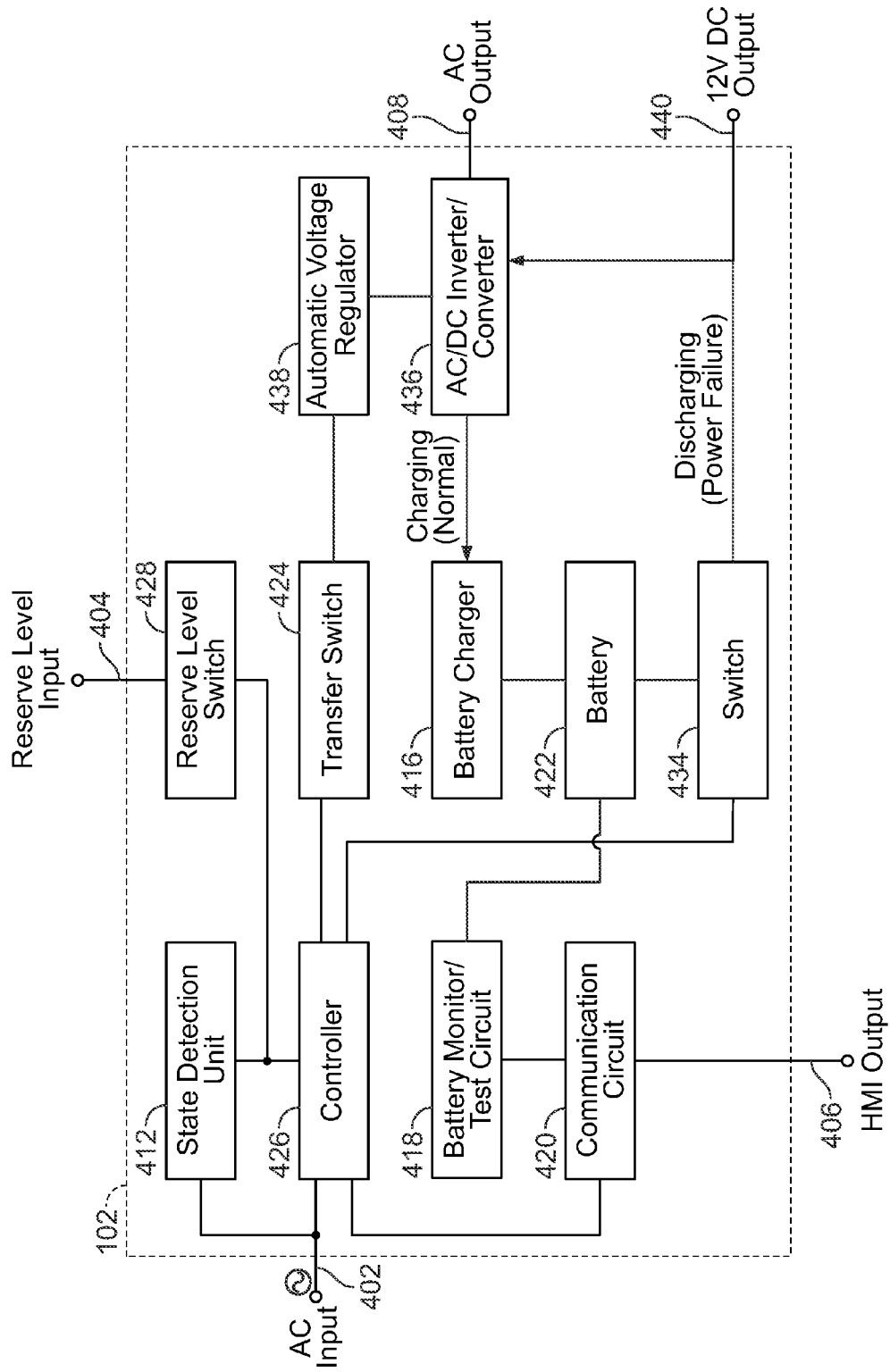
FIG. 5 is a functional block diagram of another embodiment of the UPS with on-demand reserve power, based on a line-interactive UPS design.

FIG. 5 is a functional block diagram of another embodiment of the UPS 102 with on-demand reserve power, based on a line-interactive UPS design. The external connections to the UPS 102 are essentially the same as those described with respect to FIG. 4 and operate the same, except that there is no corresponding optional computer connection 410 illustrated and a 12V DC output 440 has been added. The computer connection 410 can be adapted to this embodiment of the UPS 102 in conjunction with the PC interface 430 that connects to the controller 426, as discussed with respect to FIG. 4 above. The internal elements of the UPS 102 illustrated in FIG. 5 comprise most of the same elements as those discussed with respect to FIG. 4, with the exception of the deletion of the PC interface 430 (as mentioned above), the surge suppressor and filter 400, the AC/DC converter 414, and the DC to AC inverter 432. These elements individually operate as described with respect to FIG. 4, but are interconnected somewhat differently in FIG. 5. Additional internal elements to the UPS 102 are the automatic voltage regulator 438, the AC/DC inverter/converter 436, the switch 434, and the 12V DC output 440, which can comprise a different DC voltage level in other embodiments. The DC output 440 can be used to power the VoIP system 122 instead of the AC output 408 by connecting the power cable 118 to the DC output 440 by an appropriate connector (not shown) on the rear panel 312 (see FIG. 3).

The line-interactive UPS design is the most common design used for small business, Web, and departmental servers. In the modified line-interactive UPS block diagram of FIG. 5, the battery 422 is connected to the switch 434 and in turn to the AC/DC inverter/converter 436. In a standard line-interactive UPS, the AC/DC inverter/converter 436 would always be connected to the AC output 408 connection. In the design of FIG. 5, however, the switch 434 (as controlled by the controller 426) stops the battery from supplying reserve power to both the AC output connection 408 and the DC output 440 when the energy level remaining corresponds to the first reserve power quantity selected by the user. This allows the UPS 102 to be reactivated later utilizing the second reserve power quantity selected by the user, as described with respect to FIG. 4. Operating the inverter portion of the AC/DC inverter/converter 436 in reverse during times when the input AC main line connected to the AC input 402 is operating normally, provides power to charge the battery 422 via the battery charger 416 while the battery supplies power to the VoIP system 122 via the DC output 440. The battery charger 416 prevents overcharging of the battery 422 from the AC main line.

When the AC main line connected to the AC input 402 fails, the transfer switch 424 opens and the power flows from the battery 422 via the switch 434 to the AC output 408. With the inverter always on and connected to the AC output 408, this design provides additional filtering and yields reduced switching transients when compared with the standby UPS design of FIG. 4. In addition, the line-interactive design of FIG. 5 adds an automatic voltage regulator 438 that boosts the voltage level output to the AC output 408 during times when low voltage conditions exist at the AC input 402. Otherwise, low voltage conditions can cause the UPS 102 to transfer to battery power in an effort to boost the output voltage provided to the AC output 408. Such an action would prematurely run down the first and/or second reserve power quantity of the battery 422. The AC/DC inverter/converter 436 can also be configured so that if a failure occurs, power can still flow from the AC input 402 to the AC output 408. This action eliminates the potential of single point failure and effectively provides for two independent power paths to the AC output connection 408 (i.e., from the AC input 402 and from the battery 422 via the AC/DC inverter/converter 436).

One of skill in the art will recognize that the invention can be adapted to other types of UPS designs than the standby UPS of FIG. 4 and the line-interactive UPS of FIG. 5, such as a standby on-line-interactive UPS, standby-ferro UPS, double conversion on-line UPS, and a delta conversion on-line UPS and the like.

Figure 6:
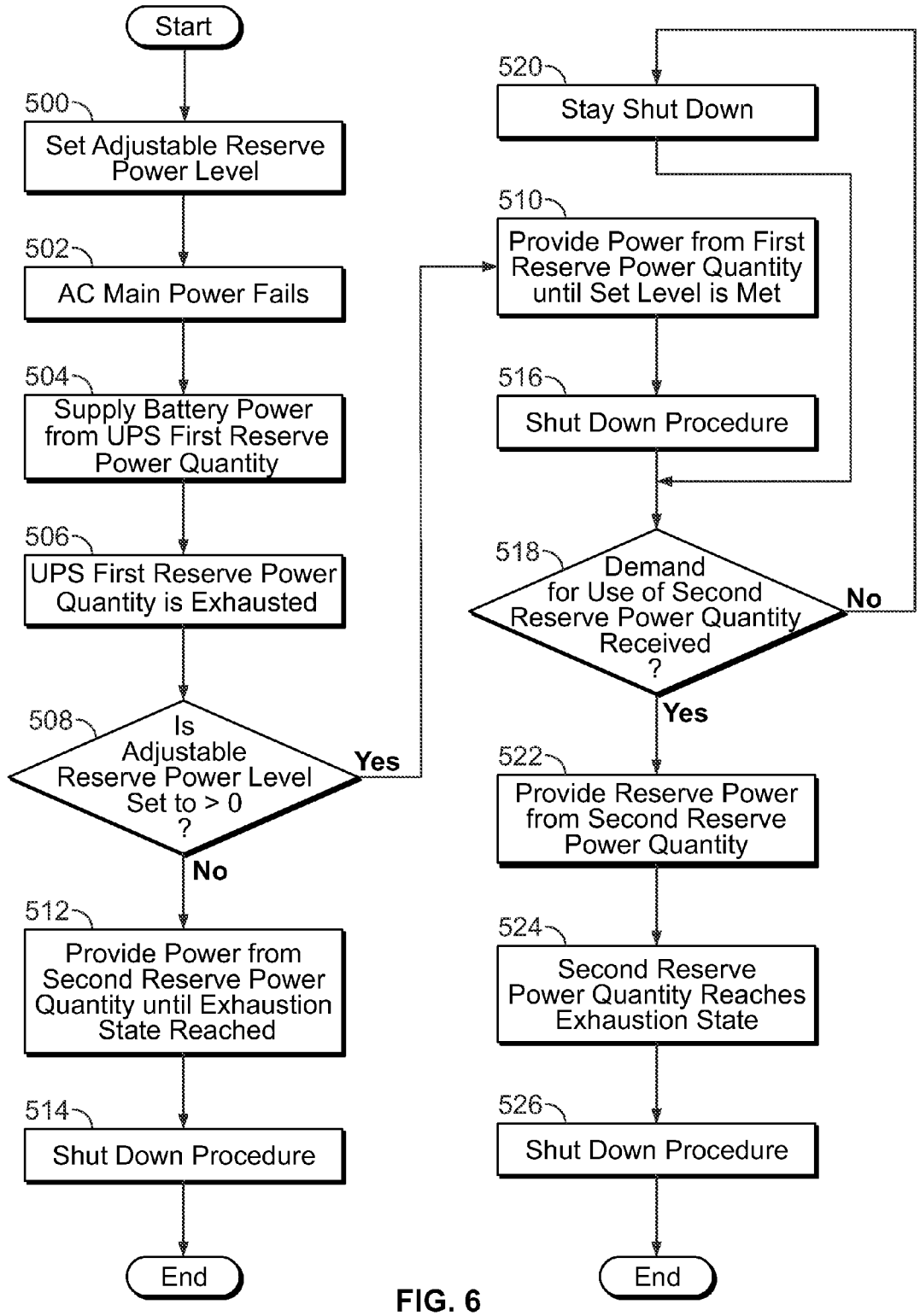
FIG. 6 is flowchart illustrating a method of providing a user of the UPS with an adjustable reserve power quantity.

FIG. 6 is a flowchart of a method of providing the user of the UPS 102 with an adjustable reserve power quantity. At step 500, the user sets the desired reserve level from the available reserve power quantity supplied by the internal battery. The method illustrated best pertains to the modified standby UPS design of FIG. 4, but can be easily adapted to work with the modified line-interactive UPS design of FIG. 5 or other UPS designs. At step 502, the AC main power input to the UPS has failed. At step 504, the UPS begins to supply AC output power from the first reserve quantity of the UPS to the AC output connection 408. This power continues to be provided until the first reserve power quantity becomes exhausted at step 506.

At step 508, the UPS determines whether the user has set the first reserve power quantity or level to greater than a zero setting. If the answer to the logical question is false or no, than the UPS continues to provide power to the AC output connection of the UPS from the first reserve power quantity until that quantity of reserve power from the backup power supply is nearly exhausted. Then, a shutdown procedure begins at step 514, wherein a shutdown signal is transmitted to an interconnected computer or VoIP system, causing any running software to close followed by an exit from the operating system. The method then ends.

If at step 508, the answer to the logical question is true or yes, than the method proceeds to step 510 and AC power continues to be supplied to the AC output connection terminal of the UPS until the reserve power level set by the user at step 500 is met. At step 516, the shutdown procedure commences as described at step 514. At step 518, the UPS determines whether the user has made a demand or request to reactivate the UPS utilizing the second reserve power quantity. If the answer to the logical question is false or no, then the UPS remains shut down at step 520 until either the AC main line connected to the UPS is restored or the user makes an affirmative demand to reactivate the UPS from the second reserve power quantity, as determined at step 518.

If at step 518, the answer to the logical question is true or yes, then the method proceeds to step 522 and the UPS is reactivated utilizing the second reserve power quantity. The second reserve power quantity continues to supply power to the AC out connection 408 until at step 524, the reserve supply is nearly exhausted, as occurred at 512. Then, the shutdown procedure begins, as discussed above at step 514, and the method ends.

The method of FIG. 6 illustrates the use of the shutdown procedure at steps 514, 516 and 526; however, the method can also be adapted to trigger the interconnected computer to enter the sleep mode, so that the user can reactivate the UPS remotely from her interconnected computer before the second reserve power supply becomes exhausted. Ultimately, the method can then trigger shutdown of the user's computer as the second reserve power quantity nears exhaustion at step 526, unless the AC main line is restored before this occurs.

In another embodiment the invention (not shown), a system is provided for controlling the utilization of backup power in a computer network. The system comprises a server connected to the computer network and an application executing in association with the server. Together, the system can receive a user input regarding how much power to reserve, set a reserve level based on the user input, and measure the level of the backup power available. The system then determines whether the measured level meets the set reserve level, and determining whether there is a power outage. During the power outage, when the measured level fails to meet the set reserve level, the system causes shutdown of the devices connected to the system. When the system later determines that a user demand to utilize the backup power has been received, the system then utilizes the backup power.

Having thus described embodiments of a UPS with an adjustable reserve power level that can provide reserve power to an attached electrical load from the internal battery of the UPS upon demand from the user, it should be apparent to those skilled in the art that certain advantages of the invention have been achieved. For example, the user can remotely adjust the desired reserve power level of the backup power supply based on an estimate of the remaining time for the battery to supply adequate power for the electrical load currently connected to the UPS. It should also be appreciated that various modifications, adaptations, and alternative embodiments thereof may be made within the scope and spirit of the present invention. For example, a remote signal command may be communicated over a wireless network to reactivate the UPS after it has been shut down.

The invention is defined solely by the following claims.

What is claimed is:

1. A method for controlling an uninterruptible power supply (UPS), comprising:
   setting by at least one processor a reserve level based on a user input;
   estimating by said at least one processor a level of power available in at least one battery, comprising:
     retrieving from memory a remaining life value for said at least one battery;
     determining whether said at least one battery is being used to power at least one load;
     measuring a temperature of at least said at least one battery; and
     using at least one algorithm, said remaining life value, said determination of whether said at least one battery is being used to power said at least one load, and said temperature to estimate said remaining life of said at least one battery;
   determining by said at least one processor whether the estimated level meets the set reserve level;
   determining by said at least one processor whether there is a power outage; and
   during the power outage, effecting by said at least one processor a shutdown of said UPS when the estimated level fails to meet the set reserve level, and utilizing the battery power after said shutdown and when a user demand for backup power is received.

2. The method of claim 1, wherein said remaining life value comprises a predetermined life expectancy value of said at least one battery.

3. The method of claim 1, wherein said remaining life value comprises a previously estimated remaining life of said at least one battery.

4. The method of claim 1, further comprising activating at least one indicator if said remaining life is equal to or below an end of life value.

5. The method of claim 1, further comprising activating at least one indicator if said remaining life is equal to or below a predetermined value, said predetermined value being a percentage of an end of life value.

6. The method of claim 1, further comprising using said algorithm to decelerate said remaining life estimation of said at least one battery if said at least one battery is not being used to power said at least one load.

7. The method of claim 6, wherein said algorithm is used to decelerate said remaining life estimation of said at least one battery by approximately 20 percent if said at least one battery is not being used to power said at least one load.

8. The method of claim 1, further comprising using said algorithm to accelerate said remaining life estimation of said at least one battery if said temperature is above a predetermined value.

9. The method of claim 8, wherein said algorithm is used to accelerate said remaining life estimation of said at least one battery if said temperature is above 25 degrees Celsius.

10. The method of claim 9, wherein said algorithm is used to accelerate said remaining life estimation of said at least one battery by approximately 40 percent for every 5 degrees Celsius that said temperature is above 25 degrees Celsius.

11. The method of claim 1, wherein said step of estimating said remaining life of said at least one battery is performed at predetermined time intervals.

12. An uninterruptible power supply (UPS) comprising:
    an AC/DC converter in communication with an AC power source;
    at least one battery selectively connected to at least one load;
    a battery charger in communication with said AC/DC converter and said at least one battery for charging said at least one battery;
    an input device for receiving a user input; and
    a processor module operatively coupled to the user input device, the processor module being configured to:
      set a reserve level based on the received user input;
      estimate a level of power available in said at least one battery by using at least (i) a prior remaining life value of said at least one battery, (ii) a value indicative of whether said at least one battery is being used to power said at least one load, and (iii) a temperature of at least said at least one battery;
      determine whether the estimated level meets the set reserve level;
      determine whether there is an interruption in power form the AC power source;
      effect a shutdown of said UPS when the measured level fails to meet the set reserve level during the power interruption; and
      utilize power available in said battery after said shutdown and when a user demand for backup power is received.

13. The system of claim 12, wherein said prior remaining life value comprises a predetermined life expectancy of said at least one battery.

14. The system of claim 12, wherein said prior remaining life value comprises a previously estimated remaining life of said at least one battery.

15. The system of claim 12, wherein said test circuit is further adapted to store said remaining life of said at least one battery in a memory device.

16. The system of claim 12, further comprising a communication circuit in communication with said test circuit and adapted to notify a user of said UPS that said at least one battery needs to be replaced.

17. The system of claim 12, wherein said test circuit is further adapted to decelerate said estimation of said remaining life of said at least one battery if said value indicates that said at least one battery is not being used to power said at least one load.

18. The system of claim 12, wherein said test circuit is further adapted to accelerate said estimation of said remaining life of said at least one battery if said temperature is above a predetermined value.

19. The system of claim 12, wherein said test circuit further comprises a memory and is further adapted to estimate said remaining life of said at least one battery at predetermined intervals and to store said remaining life in said memory as said prior remaining life value after each one of said predetermined intervals.

20. An uninterruptible power supply (UPS) comprising:
- an AC/DC converter in communication with an AC power source;
- at least one battery selectively connected to an AC output;
- a DC/AC converter in communication with said at least one battery and said AC output;
- a battery charger in communication with said AC/DC converter and said at least one battery for charging said at least one battery;
- a processor module configured to receive a user input; and
- a memory module operatively connected to the processor module, the memory module comprising executable code operable by the processor module to:
  - set a reserve level based on the user input;
  - estimate a level of power available in said at least one battery;
  - determine whether the estimated level meets the set reserve level;
  - determine whether there is an interruption in power from the AC power source;
  - effect a shutdown of said UPS when the estimated level fails to meet the set reserve level during the interruption in power; and
  - utilize the power in said at least one battery after said shutdown and when a user demand for the same is received during the interruption in power.

* * * * *